United States Patent [19]

Verhoeven et al.

[11] 4,378,330

[45] Mar. 29, 1983

[54] DUCTILE ALLOY AND PROCESS FOR PREPARING COMPOSITE SUPERCONDUCTING WIRE

[75] Inventors: John D. Verhoeven; Douglas K. Finnemore; Edwin D. Gibson; Jerome E. Ostenson, all of Ames, Iowa

[73] Assignee: The United States of America as represented by the Department of Energy, Washington, D.C.

[21] Appl. No.: 19,808

[22] Filed: Mar. 12, 1979

[51] Int. Cl.$^3$ .......................... C22F 1/08; H01L 39/00
[52] U.S. Cl. ...................................... 420/432; 29/599;
148/11.5 Q; 420/495
[58] Field of Search ...................... 75/153, 174, 134 C;
148/11.5 R, 11.5 C, 127, 133, 11.5 F, 11.5 Q;
29/599

[56] References Cited

U.S. PATENT DOCUMENTS

| | | | |
|---|---|---|---|
| 3,290,186 | 12/1966 | Rosi et al. | 75/174 |
| 3,817,746 | 6/1974 | Tsuei | 75/174 |
| 3,818,578 | 6/1974 | Raymond et al. | 29/599 |
| 3,905,839 | 9/1975 | Hashimoto | 148/11.5 R |
| 3,907,550 | 9/1975 | Critchlow | 29/599 |
| 4,000,014 | 12/1976 | Winter | 29/599 |

FOREIGN PATENT DOCUMENTS 1445723  8/1976  United Kingdom ................. 75/174

OTHER PUBLICATIONS

Tsuei, *IEEE Transactions on Magnetics*, vol. MAG-11, No. 2, pp. 272-275, Mar. 1975.
Verhoeven et al. (Verhoeven), *Appl. Phys. Lett;* vol. 33, pp. 101-102, Jul. 1978.

*Primary Examiner*—Peter K. Skiff
*Attorney, Agent, or Firm*—James W. Weinberger; Frank H. Jackson; Richard G. Besha

[57] ABSTRACT

An alloy for the commercial production of ductile superconducting wire is prepared by melting together copper and at least 15 weight percent niobium under non-oxygen-contaminating conditions, and rapidly cooling the melt to form a ductile composite consisting of discrete, randomly distributed and orientated dendritic-shaped particles of niobium in a copper matrix. As the wire is worked, the dendritric particles are realigned parallel to the longitudinal axis and when drawn form a plurality of very fine ductile superconductors in a ductile copper matrix. The drawn wire may be tin coated and wound into magnets or the like before diffusing the tin into the wire to react with the niobium. Impurities such as aluminum or gallium may be added to improve upper critical field characteristics.

7 Claims, 3 Drawing Figures

DUCTILE ALLOY AND PROCESS FOR PREPARING COMPOSITE SUPERCONDUCTING WIRE

CONTRACTUAL ORIGIN OF THE INVENTION

The invention described herein was made in the course of, of under, a contract with the U.S. DEPARTMENT OF ENERGY.

BACKGROUND OF THE INVENTION

This invention relates to a ductile copper-niobium alloy, to a method for preparing the alloy, and to a method for the commercial production of composite superconducting wire.

One present method used commercially for preparing multifilament composite superconducting wire such as $Nb_3Sn$ in a predominately copper matrix consists in mechanically drilling a large number of holes in a copper or bronze billet, inserting a rod of niobium into each hole and extruding, swaging and drawing the billet in several steps until the niobium rods are reduced to the desired filament size. The wire must then be reacted in order to form $Nb_3Sn$. This process is described in detail in an article by Eric Gregory in *Manufacture of Superconducting Materials*, R. W. Meyerhoff, Editor, American Society for Metals, 1977. The process is expensive and exacting and the size generally limited to filaments larger than 2 $\mu$m in diameter.

In another method, cylindrical rods of niobium are inserted into tubes of normal metal, such as copper, to form a composite rod. A large number of the composite rods, which are hexagonal in cross-section to improve packing density, are then tightly packed into an extrusion can of normal metal, sealed and reduced in cross section by various methods of hot and cold working to produce a multifilament composite wire containing elements of superconducting material in a matrix of normal material. Preparation of the composite rods is difficult and time consuming because of close tolerances necessary to ensure a good bonding between the metals and to prevent contamination. The hexagonal outer surface of the tubes must be dimensionally accurate so that large numbers of the rods can be tightly packed into the extrusion can to prevent trapping of gas or other contaminants between the rods which would affect the superconductor. Thus preparation of composite superconducting wire by this method is time-consuming, expensive and necessitates the acquisition of components which are expensive to meet the tolerance requirements.

To overcome these difficulties, attempts have been made to grow filaments directly from a melt in the form of long fibers or dendrites. One such alloy, described in U.S. Pat. No. 3,817,746, consists of randomly distributed superconducting particles or short filaments embedded or disposed in a ductile non-superconducting matrix which can then be worked to form composite superconducting wire. However, the resulting wire is not completely satisfactory for the preparation of superconducting components such as magnets or the like.

SUMMARY OF THE INVENTION

A ductile alloy has been prepared which is suitable for the commercial production of superconducting wire which meets many of the above described problems. The alloy consists of copper containing at least 15 weight percent niobium, the niobium being present as discrete, randomly distributed and oriented elongated dendritric-shaped particles in a copper matrix. When the alloy is cold worked to form a composite superconducting wire the niobium dendrites become orientated along the longitudinal axis and elongated to form a wire containing a plurality of fine filaments of superconductor embedded in a copper normal matrix. The ductile alloy is prepared by heating copper containing at least 15 weight percent niobium to melting temperature under non-oxygen-contaminating conditions and rapidly cooling the molten mixture to form a ductile composite consisting of a copper matrix containing a plurality of discrete randomly distributed and orientated dendritic-shaped fibers of niobium. Impurities such as gallium, aluminum or indium may also be added in small amounts to the matrix or to the niobium to control superconducting and normal parameters.

The production of superconducting wire from the alloy of the invention provides several advantages over other processes for preparing composite superconducting wire. For example, the alloy is highly ductile so that it is possible to swage and draw the alloy into wire without resort to any intermediate anneals. The niobium fibers produced in the composite are extremely fine so that diffusion of tin into the matrix to react with the niobium to form $Nb_3Sn$ can be accomplished at the comparatively low temperature of about 500° C. This allows the winding of coils and similar devices of wire produced from the alloy of the invention and coated with tin before diffusion of the tin and formation of the brittle A-15 compound. The superconducting wire has also been found to have high strain tolerance, high strength and ease of electrical contact by soldering.

It should be noted that since the fine niobium filaments in composite wire prepared from the alloy of this invention are discontinuous rather than continuous as are filaments in wire produced from prior art drilled billets, the basic mechanism of superconductivity is somewhat different in that there are regions of weakened superconductivity or normal regions in the long dendrite material. It has been shown however, that if the filament from the long dendrite process are long enough, thin enough and sufficiently homogeneously spaced, that a superconducting wire, similar in many ways to wire produced by prior art methods is possible.

It is therefore one object of the invention to provide a ductile alloy of copper and niobium which can be used for the commercial production of composite superconducting wire, and to a method of preparing the alloy.

It is the other object of the invention to provide a improved method of producing composite superconducting wire of niobium-tin in a copper matrix.

DESCRIPTION OF THE PREFERRED EMBODIMENT

Figure 1:
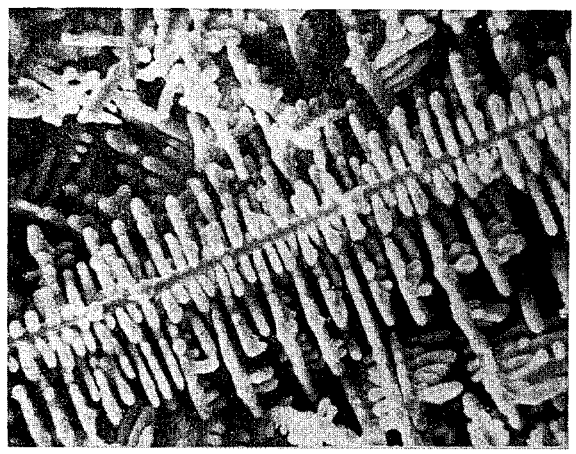
FIG. 1 is a microphotograph showing Cu-20 wt percent niobium alloy chill cast showing the niobium dendritic formation 2080 magnification.

These and other objects of the invention may be met by a ductile alloy consisting of copper containing from about 20 to 40 weight percent niobium, the niobium being uniformly dispersed throughout the copper as discrete randomly orientated, dendritic shaped particles, having an aspect ratio of between 50 to 100, the dendrites generally being from about 1 to 25 μm in diameter and from about 100 to 250 μm in length.

The alloy is prepared by heating copper and an appropriate amount of niobium in a yttria or thoria crucible under an inert atmosphere to about 1850° to 1880° C. for 5 to 15 minutes and chill casting by pouring the melt into a water cooled mold so that the casting freezes from one end.

The copper alloy must contain at least 15 weight percent niobium and may contain up to about 60 weight percent niobium although at concentrations of 60 percent and higher the alloy begins to lose some ductility. Preferably the alloys contain 20 to 40, most preferably about 30 weight percent niobium. Impurities such as gallium, aluminum or indium in amounts from about 1 to about 10 weight percent may be added to the alloy in order to improve properties of the superconducting wire such as upper critical field. While it is impossible to define the amounts and impurities to provide an improvement in a specific property, improvements are well known and readily determinable by those skilled in the art.

The copper and niobium must be melted under non-oxygen contaminating conditions. By this is meant that there must be no free oxygen available to contaminate the alloy since it has been found that an oxygen content above about 2500 ppm by weight results in the formation of an alloy containing spheres of niobium enclosing a two-phase mixture of copper and niobium rather than dendritic shaped particles. It is therefore important that the starting copper and niobium be highly purified and that the melting be done under an atmosphere of oxygen-free inert gas such as argon in a non-oxygen releasing crucible. Crucible materials which have been found to be satisfactory include yttria, thoria, graphite and yttria stablized zirconia.

It is preferred that the melt be held at a temperature of about 1850° to 1880° C. for from about 5 to 15 minutes in order to produce sufficient homogeneity in the alloy.

Preferably, the melt is rapidly cooled by chill casting so that the casting freezes from one end in order to promote dendritic growth within the copper matrix. The cooling rate has been found to affect the diameter of the dendrites. Thus a fast cooling rate, such as that attainable in a water-cooled copper chill mold results in dendritic diameters of about 1 μm while the addition of a thin graphite sleeve in the mold to slow the cooling rate, produced dendrites of about 5 μm in diameter while still maintaining an aspect ratio of about 100. Still slower cooling rates obtained by cooling the melt directly in the crucible, without casting, by a controlled lowering of the power (about 15°/min.) produced dendrites up to 25 μm in diameter.

Superconducting wire can be readily prepared from the cast ductile alloy of the invention by suitably working the alloy such as by swaging and drawing a cylindrical billet of the alloy down to achieve sufficient size reduction to form a composite wire of niobium filaments in a copper matrix. Because of the ductility of the alloy, it is usually possible to accomplish this reduction without resorting to any intermediate anneals. The drawn wire can then be provided with a thin layer of tin by any of several methods known in the art, such as plating by passing the wire through a molten bath. Because of the fineness of the niobium filaments and the ductility of the coated wire, it has been found that a temperature of only about 550° C. for several days is necessary to diffuse the tin into the wire to react with the niobium to form $Nb_3Sn$. Thus it is possible to wind the wire into magnets or into any other desired shape and to heat the entire magnet rather than to form the brittle $Nb_3Sn$ and then prepare the magnet. This is possible since many electrical insulators such as quartz are not destroyed at this temperature but are destroyed at the higher diffusion temperatures required by other materials.

The resulting product has a $J_c$ (at H=0) greater than $10^6$ A/cm$^2$, has a $J_c$ (at H=14 Tesla) greater than $10^4$ A/cm$^2$. The strength of the material is comparable to steels, greater than 140 ksi at both room temperature and 4.2 K. If the wire is subjected to mechanical strain ($\epsilon$), $J_c$ increases by about 20% until $\epsilon=0.75\%$ and then decreases a corresponding amount at higher strain. The $J_c$ (H, $\epsilon$) curve is reproducible for all strain out to 1.4%. At higher strain there is permanent degradation of the material on repeated cycling. Bend tests show that degradation of $J_c$ after bending gives results consistent with the uniaxial strain. The wire has a Cu rich surface to which soft solder joints can be made easily. There are wide ranges of parameters (such as Nb content, Sn content, Ga content, dendrite size, filament size, area reduction, reaction temperature, reaction time, fabrication techniques) available so that wires can be designed for specific applications such as magnets, transmission lines and generators.

The following examples are given as illustrative of the invention and are not to be taken as limiting the scope of the invention as defined by the appended claims.

EXAMPLE I

A $Cu_{80}Nb_{20}$ alloy was melted at 1850 for 5 minutes and cast into a Cu chill mold as a cylindrical rod 1.27 cm diameter and 7 cm long. The heat flow was predominantly along the cylinder axis during solidification. FIG. 1 is a scanning electron microscope picture of the alloy and shows that the Nb precipitates in the Cu matrix are dendritic in form, 100 μm long, 1 μm in diameter with regular side branches 7 μm long. After the rod is swaged and drawn to 0.015 cm diameter wire the Nb takes the form of long ribbons through the Cu matrix ranging from 2,000 to 10,000 Å wide. The spacing between ribbons through the Cu matric ranges from 2,000 to 10,000 Å and the ribbons are homogeneously spaced on this scale. The wire is coated with tin and run through a die leaving a total diameter of 0.0161 cm so that the wire is coated with about 9 weight percent tin. The coated wire was then heated at 550° C. for 3 to 6 days to diffuse the tin into the wire to form $Nb_3Sn$. Resistivity measurements indicates the copper matrix contained about 1 atom percent after reaction.

It is very important that the composite be homogeneous on this scale for the following reason. Experiments in aligned composites such as those published in Physical Review B 18, 1219 (1978) clearly indicate that supercurrents on the order 100 Amperes/cm$^2$ can flow as a supercurrent (zero electrical resistance) between two superconducting fibers through a normal metal matrix as much as 20,000 Å thick. This process is called the proximity effect. With the given length and area of the ribbons in this invention, the discontinuous $Nb_3Sn$ filaments are strongly coupled by supercurrents through the Cu matrix for current densities less than $10^7$ $A/cm^2$ averaged over the entire wire.

For high field $J_c$ measurements, the samples were reacted in a hair pin geometry because the applied magnetic fields were parallel to the cryostat axis. A region 10 to 12 cm long was available for current contacts in the portion of the sample parallel to the applied magnetic field. A 1 cm straight section was maintained perpendicular to the field. A brass shunt having a resistance of 0.002 ohms was placed in parallel with the sample to limit the heating effects when the sample goes normal. Voltages were detected with a Kiethley 148 or 155 voltmeter and displayed on an X-Y recorder. Magnetic fields above 8 T were provided by the air core 2 Y magnet at the National Magnet Laboratory. A 1 $\mu V$ criterion was used to define $J_c$ rather than a 0.1 $\mu V$ because the current ramp introduced extra noise during some of the data taken at high magnetic field. The difference between $J_c$ (1 $\mu V$) and $J_c$ (0.1 $\mu V$) is less than 10% and makes no substantial difference in the results.

For this example the $J_c$ vs H curve (based on the total area of the Cu matrix as well as the $Nb_3Sn$) crosses $10^6$ $A/cm^2$ at 0.5 Tesla, it crosses $10^5$ $A/cm^2$ at 6 Tesla and $10^4$ $A/cm^2$ at 12 Tesla. The $J_c$ at 7 Tesla increases with applied uniaxial strain up to 0.7% and shows no permanent degradation in $J_c$ for strains up to 1.4% as reported in IEEE Trans on Mag., 15 page 197, (January 1979). A 0.006" wire of this invention can be repeatedly bent around a 0.32 cm radius mandrel without breaking. The ultimate tensil strength of the wire is greater than 140 ksi. The outside surface of the wire has a surface layer which is predominantly Cu so electrical contact is easily made by soldering with 50—50 Pb-Sn solder. The reaction temperature of 550° C. is low enough that electrical insulation such as quartz will not be destroyed by the reaction process. This means that magnets can be wound before reaction, with high temperature insulation such as quartz fiber, and reacted after winding.

EXAMPLE II

The process of Example I was repeated except that the Nb content in the chill casting is increased to 30 weight %. In this composite the $J_c$ vs H curve is much higher starting from $1.8 \times 10^6$ at zero Tesla and crossing $10^5$ $A/cm^2$ at 10.2 Tesla and $10^4$ $A/cm^2$ at 14.4 Tesla. $H_{c2}$ for this composite is about 16.5 Tesla. Both $J_c$ and $H_{c2}$ are increased with increasing Nb content by 0.15 T/% Nb. Otherwise fabrication, handling and strain effects are as in Example I.

EXAMPLE III

Figure 2:
FIG. 2 is a microphotograph of 10 mil composite wire prepared from a Cu-40 wt percent niobium alloy showing alignment of Nb dendrites by mechanical elongation 5700 multiplication.

Example I was repeated except that the Nb content in the chill casting is increased to 40 weight % Nb. At this Nb content $J_c$ at any given field is slightly (10%) higher than Example II and $H_{c2}$ is 1.5 Tesla higher. The material, however, becomes substantially more brittle and more difficult to fabricate. The advantage is the somewhat higher critical current. FIG. 2 is a scanning electron microscope photograph taken of this material after working, showing the elongated niobium filaments. The photo shows that the filaments are very long, having lengths which may vary up to several cm.

EXAMPLE IV

Figure 3:
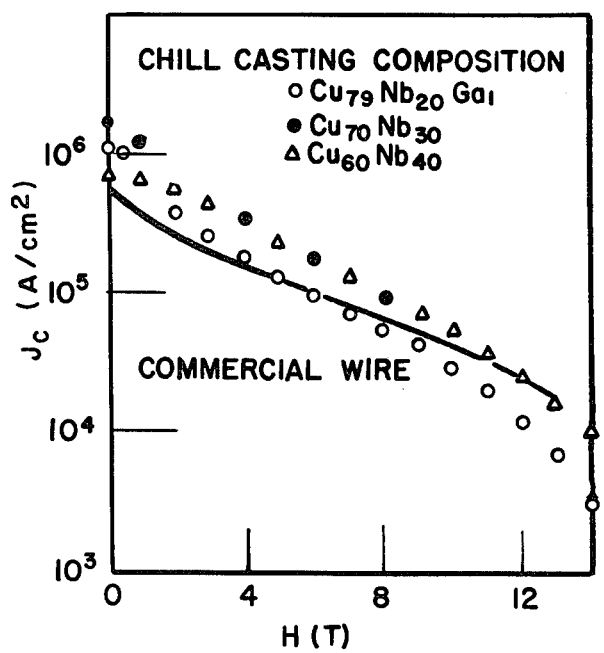
FIG. 3 is a graph showing the magnetic field dependence of the critical current for several niobium concentrations in the original casting.

Example I was repeated except that 5 weight % Ga is added to the original melt to give $Cu_{75}Nb_{20}Ga_5$. Performance is essentially the same as Example I except that $H_{c2}$ is raised to 17.5 Tesla. The increase in $H_{c2}$ with Ga content is about 0.5 Tesla per weight % Ga. The addition of Ga gives better performance at high field. FIG. 3 is a graph comprising the magnetic field dependence of the critical current for superconducting wire prepared from the alloys of Examples II, III and IV, and comparing them with commercially available wire.

EXAMPLE V

Example IV was repeated except that the reaction temperature is lowered to 500° C. and the reaction time extended to 11 days. Performance is similar to Example IV with $J_c$ vs H crossing $9.3 \times 10^5$ $A/cm^2$ at H=0, crossing $10^5$ $A/cm^2$ at H=4.5 Tesla, and crossing $10^4$ $A/cm^2$ at 12 Tesla. $H_{c2}$ was 17 Tesla for this example. The advantage of this material is that magnets can be wound before reaction providing the insulation will withstand 500° C.

EXAMPLE VI

Example II was repeated except that the wire is plated with 15% Sn bronze rather than pure Sn. The reaction time also is increased to accomodate the somewhat longer diffusion distance for the Sn. Current density in the core has the same behavior as for the Sn plated material. The advantage of this product is that the wire before reaction has a very ductile bronze surface suitable for braiding before reaction.

EXAMPLE VII

Example I was repeated except that the wire is drawn to 0.025 cm diameter and then rolled into a ribbon 0.0064 cm thick. After Sn or bronze plating and reaction the ribbon has essentially the same performance characteristics as a wire of the same cross sectional area. This ribbon can be repeatedly bent around a 0.5 cm radius mandrel with no measurable degradation in critical current performance. The advantage of this material is that it is very robust, flexible in one direction and easy to wind on a cylindrical form for a magnet. Lateral flexibility of the ribbon is reduced substantially.

EXAMPLE VIII

Example I was repeated except that the molten CuNb ingot is cooled more slowly over a period of several seconds. The resulting dendrites are ~8 $\mu m$ diameter instead of ~1 $\mu m$. Critical curves are ~10% higher at a given field than Example I but $H_{c2}$ remains unchanged. This material can be reacted at higher temperatures for shorter times because there is less tendency for coarsening of the filaments as they are transformed from Nb to $Nb_3Sn$. Reaction at 650° C. for 21 hours provides full transformation of the Nb to $Nb_3Sn$. The short reaction time is the key advantage of this example.

EXAMPLE IX

Example I was repeated except that larger amounts of Sn are plated on the surface. The resulting performance critical current characteristics improve by about 20% up to 13 volume percent Sn and then diminish at higher concentration. The higher Sn content makes the resistivity of the matrix higher by about $1\mu$ $\Omega cm$ per atomic percent and the wire becomes more brittle. The advantage of the material is the higher $J_c$.

EXAMPLE X

Example I was repeated except that the casting technique was changed to the consumable arc casting technique. For example, a coaxial cylinder of 1⅛" copper surrounding a ½" Nb rod was consumable arc melted into a 2" Cu mold. The mold may also contain a thin liner made out of a material such as graphite to slow the cooling rate. The 2 inch ingots were then processed as in Example I after drawing to wire. The ingots could also be used as starting electrodes to consumably arc melt 3 to 4" diameter ingots. The advantage here is that consumable arc melting is an established industrial process readily adaptable to this process.

EXAMPLE XI

Example I was repeated except that a 2 inch cast billet was prepared. The billet was then encased in a copper shell whose wall thickness was adjusted to about 10% of the cross-sectional area. The billet was then extruded and drawn to wire, followed by tin coating and reaction. The advantages of this method are that longer quantities of wire are produced and the copper cladding allows easier drawing of the wire. $J_c$ vs H properties of the wire were found to be equivalent to the wire prepared in Example I, indicating that the method of the invention can be used for the preparation of larger quantities of ductile alloy suitable for the commercial production of composite superconducting wire.

As can be seen from the proceeding discussion and examples, the invention provides an alloy, a method for preparing the alloy and a method for preparing composite wire from the alloy which is suitable for superconducting application.

The embodiments of the invention in which an exclusive property or privilege is claimed are defined as follows:

1. A ductile alloy for preparing composite superconducting wire comprising copper and from 20 to 60 weight percent niobium, the niobium being present in the copper as discrete, randomly distributed and oriented, elongated dendritic-shaped particles having a diameter from about 1 μm to about 25 μm and an aspect ratio of between 50 to 100.

2. The ductile alloy of claim 1 wherein the alloy also contains from 1 to about 10 weight percent of an impurity selected from the group consisting of gallium, aluminum and indium.

3. A method of forming a ductile alloy of copper and niobium where the niobium is present in the copper as discrete, randomly distributed and oriented, elongated dendritic-shaped particles comprising the steps of:
   a. melting together under a non-oxygen containing atmosphere in non-oxygen releasing crucibles, a mixture of copper and at least 15 weight percent niobium to form a melt, and
   b. rapidly cooling the melt so that the melt freezes upwardly from one end to promote dendritic growth within the copper matrix.

4. The method of claim 3 wherein the mixture is heated under an inert atmosphere in a crucible made of material selected from the group consisting of yttria, thoria, graphite, and zirconia stabilized with yttria.

5. The method of claim 4 wherein the melt is rapidly cooled by casting it into a copper chill mold.

6. The method of claim 5 wherein the mixture contains from 20 to 60 weight percent niobium.

7. The method of claim 6 wherein the copper chill mold contains a thin liner of graphite to slow the cooling rate of the melt.

* * * * *